United States Patent [19]
Gardner et al.

[11] Patent Number: 5,837,572
[45] Date of Patent: *Nov. 17, 1998

[54] CMOS INTEGRATED CIRCUIT FORMED BY USING REMOVABLE SPACERS TO PRODUCE ASYMMETRICAL NMOS JUNCTIONS BEFORE ASYMMETRICAL PMOS JUNCTIONS FOR OPTIMIZING THERMAL DIFFUSIVITY OF DOPANTS IMPLANTED THEREIN

[75] Inventors: Mark I. Gardner, Cedar Creek; Fred N. Hause; H. Jim Fulford, Jr., both of Austin, all of Tex.

[73] Assignee: Advanced Micro Devices, Inc.

[*] Notice: This patent issued on a continued prosecution application filed under 37 CFR 1.53(d), and is subject to the twenty year patent term provisions of 35 U.S.C. 154(a)(2).

[21] Appl. No.: 781,461

[22] Filed: Jan. 10, 1997

[51] Int. Cl.$^6$ .................................................. H01L 21/82
[52] U.S. Cl. ...................... 438/199; 438/251; 438/275; 438/286; 438/308; 438/519; 438/522; 438/530; 257/336; 257/344; 257/369; 257/372; 257/408
[58] Field of Search ......................... 257/336, 344, 257/369, 372, 408; 438/199, 231, 275, 286, 308, 519, 522, 530

[56] References Cited

U.S. PATENT DOCUMENTS

| | | | |
|---|---|---|---|
| 4,463,491 | 8/1984 | Goldman et al. | 257/369 |
| 4,652,897 | 3/1987 | Okuyama et al. | 257/408 |
| 4,737,828 | 4/1988 | Brown | 257/344 |
| 4,788,663 | 11/1988 | Tanaka et al. | 257/408 |
| 4,952,825 | 8/1990 | Yoshida | 257/344 |
| 4,968,639 | 11/1990 | Bergonzoni | 257/336 |
| 5,216,268 | 6/1993 | Chen et al. | 257/408 |
| 5,258,319 | 11/1993 | Inuishi et al. | 257/344 |
| 5,332,914 | 7/1994 | Hazani | 257/408 |
| 5,371,394 | 12/1994 | Ma et al. | 257/344 |
| 5,477,070 | 12/1995 | Nam | 257/344 |
| 5,608,240 | 3/1997 | Kumanagai | 257/336 |

FOREIGN PATENT DOCUMENTS

| | | | |
|---|---|---|---|
| 358137255 | 8/1983 | Japan | 257/408 |
| 362200757 | 9/1987 | Japan | 257/408 |
| 363161660 | 7/1988 | Japan | 257/344 |
| 403041773 | 2/1991 | Japan | 257/344 |
| 404085968 | 3/1992 | Japan | 257/408 |
| 404171730 | 6/1992 | Japan | 257/344 |
| 405075115 | 3/1993 | Japan | 257/344 |
| 405129325 | 5/1993 | Japan | 257/344 |

*Primary Examiner*—Edward Wojciechowicz
*Attorney, Agent, or Firm*—Kevin L. Daffer; Conley, Rose & Tayon

[57] ABSTRACT

An integrated circuit is provided having both NMOS transistors and PMOS transistors. The NMOS transistor junction regions are preferably formed before the PMOS transistor junction regions with pre-defined anneal temperatures applied after select implant steps. Both the NMOS and PMOS transistor junction are graded such that the drain areas include a relatively large LDD implant area and the source junctions do not. Whatever LDD area pre-existing in the source implanted with a higher concentration source/drain or MDD implant. The ensuing integrated circuit is therefore a CMOS circuit having asymmetrical transistor junctions and carefully controlled implant and anneal sequences. The asymmetrical junctions are retained, or at least optimized, by controlling the anneal temperatures such that diffusivity distances of n-type implants are relatively similar to p-type implants. Diffusivity is controlled by regulating the post-implant anneal temperatures of p-type implants lesser than previous n-type implants.

21 Claims, 4 Drawing Sheets

CMOS INTEGRATED CIRCUIT FORMED BY USING REMOVABLE SPACERS TO PRODUCE ASYMMETRICAL NMOS JUNCTIONS BEFORE ASYMMETRICAL PMOS JUNCTIONS FOR OPTIMIZING THERMAL DIFFUSIVITY OF DOPANTS IMPLANTED THEREIN

BACKGROUND OF THE INVENTION

1. Field of the Invention

This invention relates to manufacture of a CMOS integrated circuit and, more particularly, to asymmetrical n-channel and p-channel transistors formed with optimized junction diffisivity.

2. Description of Relevant Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is produced by thermally oxidizing the silicon substrate. Thermal oxidation is achieved by subjecting the substrate to an oxygen-bearing, heated ambient in, for example, an oxidation furnace or a rapid thermal anneal ("RTA") chamber. A material to be rendered conductive is then deposited across the entire dielectric-covered substrate. The material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography. The underlying, exposed regions of the polysilicon layer can be removed leaving a polysilicon gate conductor.

An n-channel transistor, or NMOS transistor, must in most instances be fabricated different from a p-channel transistor, or PMOS transistor. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and the distance between junction regions is typically referred to as the physical channel length. After implantation and subsequent diffusion of the junction regions, the distance between the junction regions become less than the physical channel length and is often referred to as the effective channel length ("Leff"). In high density designs, not only does the physical channel length become small so too must the Leff. As Leff decreases below approximately 1.0 $\mu$m, for example, a problem known as short channel effects ("SCE") becomes predominant.

A problem related to SCE, and the subthreshold currents associated therewith, but altogether different is the problem of hot-carrier effects ("HCF"). HCE is a phenomenon by which hot-carriers ("holes and electrons") arrive at or near an electric field gradient. The electric field gradient, often referred to as the maximum electric field ("Em"), occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 $\mu$m.

Unless modifications are made to the fabrication sequence, problems resulting from HCE will remain. To minimize these problems, a mechanism must be derived that disperses and thereby reduces Em. That mechanism is often referred to as the double-diffused drain ("DDD") and lightly doped drain ("LDD") techniques. The purpose behind using DDDs and LDDs structures is to absorb some of the potential into the drain and away from the drain/channel interface. The popularity of DDD structures has given way somewhat to LDD structures since DDD may cause unacceptably deep junctions and deleterious junction capacitance.

A conventional LDD structure is one whereby a light concentration of dopant is self-aligned to the edge of the gate conductor. The light-dopant concentration is then followed by a heavier-dopant concentration which is self-aligned to a spacer formed on the sidewalls of the gate conductor. The purpose of the first implant dose is to produce a lightly doped section of both the source and drain junction areas at the gate edge near the channel. The second implant dose is spaced from the channel a distance dictated by the thickness of the sidewall spacer. Resulting from the first and second implants, a dopant gradient occurs across the junction from the source/drain area of the junction to the LDD area adjacent the channel.

The dopant gradient across the junction, henceforth referred to as a graded junction, is necessary for several reasons. First, the lightly doped region (LDD area) is used to assume a substantial portion of the entire voltage drop associated with Em. It has been reported that the LDD area may in some instances reduce Em at the drain juncture by approximately 30–40%. Secondly, the heavier dosage within the source/drain area forms a low resistivity region suitable for enhanced contact conductivity. Further, the source/drain dose is implanted at a higher energy necessary to produce deeper source/drain junctions and thereby provide better protection against junction spiking.

A properly defined LDD structure must be one which minimizes HCE but not at the expense of excessive source-to-drain resistance. The addition of an LDD implant adjacent the channel unfortunately adds resistance between the source and drain when the transistor is active. This added resistance, generally known as parasitic resistance, can have many deleterious effects. First, parasitic resistance can decrease the saturation current (i.e., current above threshold). Second, parasitic resistance can decrease drive strength and the overall speed of the transistor.

The deleterious effects of decreasing saturation current and transistor speed is best explained in reference to a transistor having a source resistance and a drain resistance. The source and drain parasitic resistances are compounded by the presence of the conventional source and drain LDDs. Using a n-channel example, the drain resistance $R_D$ causes the gate edge near the drain to "see" a voltage less than VDD, to which the drain may be operably connected. Similarly, the source resistance $R_s$ causes the gate edge near the source to see some voltage more than ground. As far as the transistor is concerned, its drive current along the source-drain path depends mostly on the voltage applied between the gate and source, i.e., $V_{GS}$. If $V_{GS}$ exceeds the threshold amount, the transistor will go into saturation according to the following relation:

$$I_{DSAT}=K/2 \cdot (V_{GS}-V_T)^2,$$

where $I_{DSAT}$ is saturation current, K is a value derived as a function of the process parameters used in producing the transistor, and $V_T$ is the threshold voltage. Reducing or eliminating $R_S$ would therefore draw the source voltage closer to ground, and thereby increasing the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCE control. Accordingly, substantially large LDD is required in the drain area. It would therefore seem beneficial to decrease $R_s$ rather than $R_D$. This implies the need for a process for decreasing $R_s$ (source-side LDD area) while maintaining $R_D$ (drain-side LDD area).

A transistor which employs dissimilarly sized source-side and drain-side LDD areas is henceforth referred to as an asymmetrical transistor, i.e., a transistor having dissimilarly sized junctions. To incorporate an asymmetrical transistors into a CMOS process embodying both NMOS and PMOS process flow to minimize HCE and source-to-drain resistance poses many problems. It is noted that a thermal anneal step is essential to diffuse and activate implanted ions and repair possible implant damage to the crystalline substrate structure. Use within a CMOS process flow implies that thermal annealing be carefully undertaken. The temperature and time required for an RTA is often tailored to the implant type and the reasons for the implant. Dopants with do not readily diffuse may require higher anneal temperatures to activate and position those dopants. Conversely, dopants which readily diffuse require lower anneal temperatures. Furthermore, higher concentrations of the dopants require a commensurate higher anneal temperature.

In a process which employs LDD implants, it would be desirable to minimize the diffusivity distance of the LDD implants since they are often closer to the channel then the source/drain implants. Excessive segregation and migration of LDD implants might further lesson Leff which would contribute to short-channel effects.

Not only is it necessary to demarcate the anneal temperatures for LDD implants verses source/drain implants, but it may also be desirable to distinguish anneal temperatures of p-type dopants verses n-type dopants. In a CMOS process which employs both types of dopants, it is generally recognized that p-type dopants, such as boron, more readily migrate than n-type dopants such as arsenic or phosphorous. It would thus be desirable to pay close attention to the anneal cycles (time and temperature) so that boron does not overly migrate when the higher temperature arsenic/phosphorous anneal occurs. Properly timed anneal cycles are therefore needed when a CMOS process employs both n-type and p-type implants, each of which further include asymmetrical junction implant areas.

SUMMARY OF THE INVENTION

The problems outlined above are in large part solved by a transistor and transistor fabrication method in which the n-type implants associated with the n-channel transistor are performed prior to the p-type implants associated with the p-channel transistor. Performing the n-type implants prior to p-type implants allows the higher temperature anneal of the n-type implants not to effect the subsequent lower temperature anneal of the p-type implants. The resulting benefit is a more optimized diffusivity of lighter boron implants relative to heavier arsenic (or phosphorous) implants. Accordingly, a CMOS integrated circuit can be produced whereby the Leff in both the n-and p-channels are more carefully controlled. Performing n-type implants prior to the more temperature sensitive p-type implants allows for a higher temperature anneal first, prior to the implant of higher diffusivity dopants. A result is minimal additional migration of the subsequent p-type source/drain implants and, especially, the p-type LDD implants placed immediately adjacent the critically sized p-channel.

It is noted that the present CMOS process undergoes careful thermal budgeting subsequent to the earlier n-type implants and the later p-type implants. According to one embodiment, two anneal cycles may occur: the first anneal occurring after all of the n-type implants and the second anneal occurring after all implants. According to another embodiment, four anneal cycles may be used. In this instance, a first anneal can occur after the n-type LDD implant, the next occurring after the n-type source/drain (or medium doped drain implant), the third anneal occurring after the p-type LDD implant and the fourth anneal occurring after the p-type source/drain (or medium doped drain) implant. Each of the various anneal cycles (temperature and duration) can be adjusted relative to one another to take into account differences in diffusivity of the immediately preceding implant concentration and depth. The result of tailoring anneal temperatures to the preceding implant is to ensure, within a CMOS process flow, that higher diffusivity implant species migrate approximately the same as lower diffusivity species.

In addition to utilizing a CMOS process which optimizes overall diffusivity, the present manufacturing sequence can also produce asymmetrical transistors. According to one embodiment, the pair of junction regions associated with the n-channel, p-channel or both n-channel and p-channel transistors can be doped dissimilar from each other. For example, a process is contemplated by which the source junction of each n-channel and p-channel transistor undergoes an additional implant. The additional implant within the source junction results in a lessening of parasitic resistance $R_S$. The drain junction, however, does not receive the additional implant. As such, the drain junction remains as having a fairly substantial LDD area relative to the resulting source junction. This LDD area is essential but only in the drain. Accordingly, the present process is deemed to produce a more properly designed LDD-embodied transistor.

Broadly speaking, the present invention contemplates an integrated circuit formed with optimal thermal anneal budgeting in addition to LDD areas prevalent only in the critical drain junctions. The integrated circuit is produced from a CMOS process with anneal cycles occurring in proper sequence and at proper temperatures to maintain optimized diffusivity.

The shortened, or eliminated, LDD area in the source-side of the junction is achieved by employing a removable spacer. The spacer is readily removed by depositing an etch stop lay on the gate conductor sidewall surfaces prior to spacer formation. After the spacer serves as an implant mask, the spacer can then be selectively removed without harming the integrity of the underlying structures. The spacer is removed only from sidewall surfaces overlying the source junction but not from surfaces overlying the drain junction. The masking material used to selectively remove the source-side spacer is preferably retained to mask the heavier implant away from the pre-existing drain-side LDD of the n- or p-type transistor being implanted.

The present integrated circuit may therefore comprise an NMOS transistor having a first channel area interposed between a first pair of junction areas. The integrated circuit further includes a PMOS transistor having a second channel area interposed between a second pair of junction areas. A first and then a second n-type concentration of dopants are forwarded into the first pair of junction areas prior to when a first and then a second p-type concentration of dopants are forwarded into the second pair of junction areas.

A gate conductor associated with the NMOS transistor extends above the first channel area between a pair of sidewall surfaces. Another gate conductor laterally spaced from the NMOS gate conductor extends above the second channel area between a pair of sidewall surfaces. The NMOS gate conductor, like the PMOS gate conductor, includes a spacer formed on each side of the pair of sidewall surfaces. The spacer can be selectively removed in succession from one sidewall surface overlying the source prior to removal from the other sidewall surface overlying the drain. After removal of one spacer, but before removing the opposing spacer, a third n-type (or p-type) concentration of dopants is forwarded into only the source junction. A masking material (i.e., photoresist) is used to mask implant from entering the drain junction. Accordingly, the third concentration of implants are used to enhance conductivity in the source junctions relative to the pre-existing source-side LDD implants, yet the drain-side LDD implant remains to minimize HCE problems.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
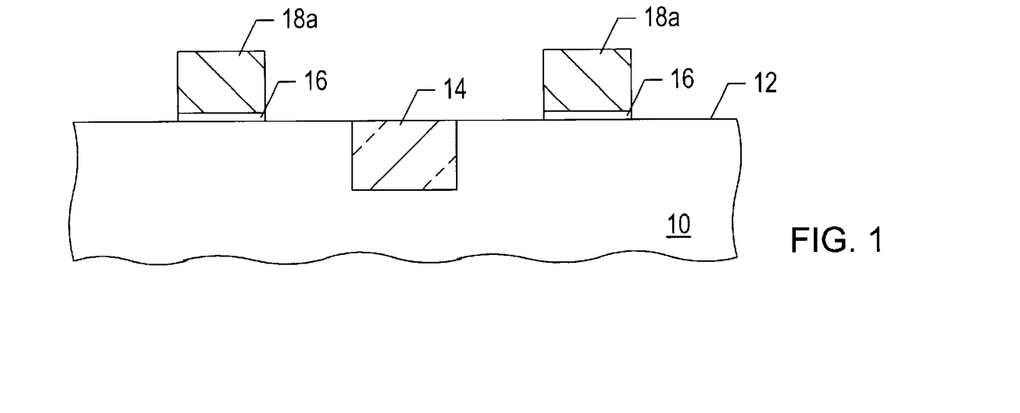
FIG. 1 is a partial cross-sectional view of the semiconductor topography showing a pair of gate conductors spaced apart by an isolation structure.

Turning now to the drawings, FIG. 1 is a partial cross-sectional view of a semiconductor substrate 10 having an upper surface 12. Semiconductor substrate 10 preferably comprises lightly doped n-type or p-type single-crystalline silicon having a resistivity suitably in the range near 12 ohms-cm. Isolation structure 14 is formed in the field region of semiconductor substrate 10. Isolation structure 14 is shown here as a shallow trench filled with a dielectric, but it may alternatively comprise a LOCOS. Patterned upon upper surface 12 are gate dielectrics 16 and gate conductors 18. Gate conductor 18a is spaced a lateral distance from gate conductor 18b with isolation structure 14 configured therebetween.

Gate conductor 18 is preferably patterned from a polycrystalline silicon ("polysilicon") material using well-known lithography procedures. Gate conductor 18 and underlying gate dielectric 16 exists in select regions between isolation structures 14, those regions defined as active regions.

Figure 2:
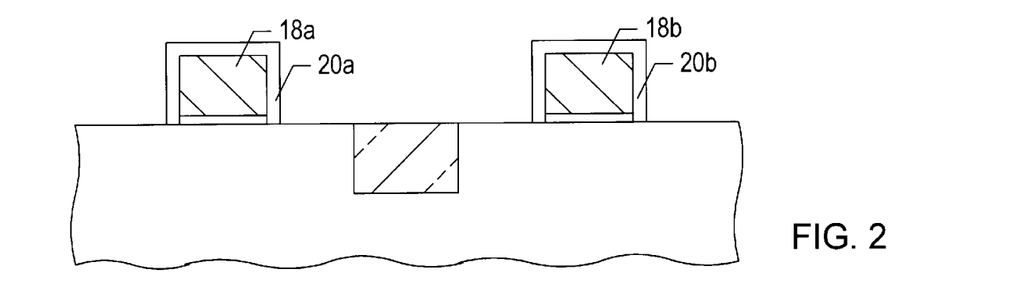
FIG. 2 is a partial cross-sectional view of the semiconductor topography according to a processing step subsequent to FIG. 1, wherein an etch stop is formed on the upper and sidewall surfaces of the gate conductors.

FIG. 2 illustrates formation of an etch stop layer 20 on the exposed surfaces of gate conductor 18. Etch stop layer 20 preferably comprises a thermally grown oxide. According to another embodiment, a nitride layer may be deposited upon the thermally grown oxide. The thermally grown oxide can be formed from either a dry oxygen or wet oxygen environment. The oxide serves many purposes, one of which is to take on a slower etch composition than to-be-formed, deposited oxide. If the oxide is used in conjunction with a nitride, then the oxide cushions the transition of stresses between the polysilicon and the subsequently placed nitride.

For sake of brevity and clarity of the drawings, etch stop layer 20a and 20b is shown only on the gate conductors 18a and 18b, respectively. However, it is understood that oxide (and possibly nitride) of the etch stop forms across the entire exposed topography, which includes the upper surfaces of gate conductors 18 and substrate 10. Etch stop 20 is not shown on the substrate so as to minimized undue clutter and complexity of the drawings which would distract from the purpose and intent of FIGS. 2–10.

Figure 3:
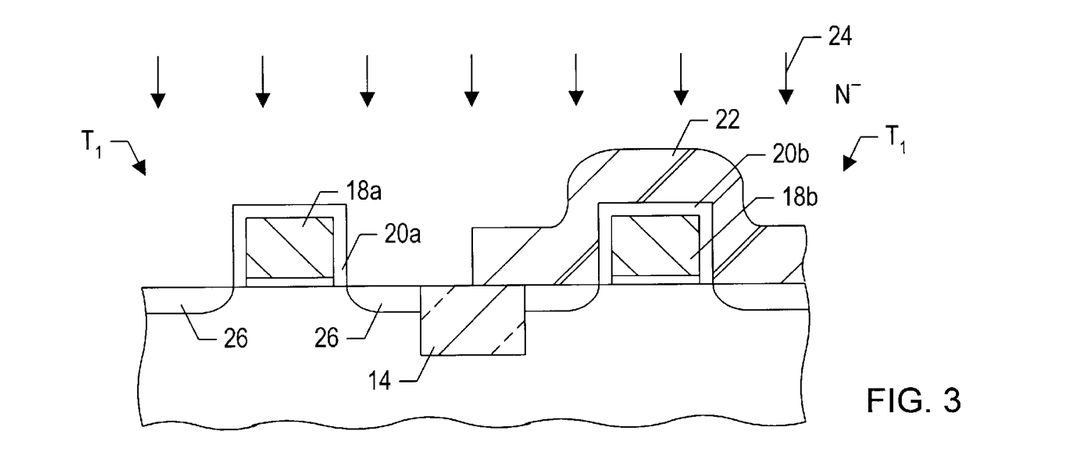
FIG. 3 is a partial cross-sectional view of the semiconductor topography according to a processing step subsequent to FIG. 2, wherein an n-type LDD implant is selectively placed in the junction regions of an n-channel transistor.

FIG. 3 depicts a masking material 22 selectively formed over the active region of one of the two illustrated transistors. Masking material 22 preferably comprises photoresist which is spin-on deposited, selectively developed and then etched to expose one transistor active area, i.e., an active area associated with gate conductor 18a. The exposed active area associated with gate conductor 18a allows implant of an n-type LDD implant species 24 into NMOS junctions to form n-type LDD implant areas 26. Implant areas 26 extend within substrate 10 between the channel below gate conductor 18a and isolation structure 14. More specifically, the combination of photoresist 22, isolation structure 14 and gate conductor 18a serve to mask implant 24 except for LDD regions 26.

Preferably, n-type LDD implant 24 comprises a relatively light concentration of phosphorous ions implanted at a relatively low implantation energy. Subsequent to LDD implant 24 and removal of photoresist 22, a first temperature anneal $T_1$ may be used to activate the LDD implant areas 26.

Figure 4:
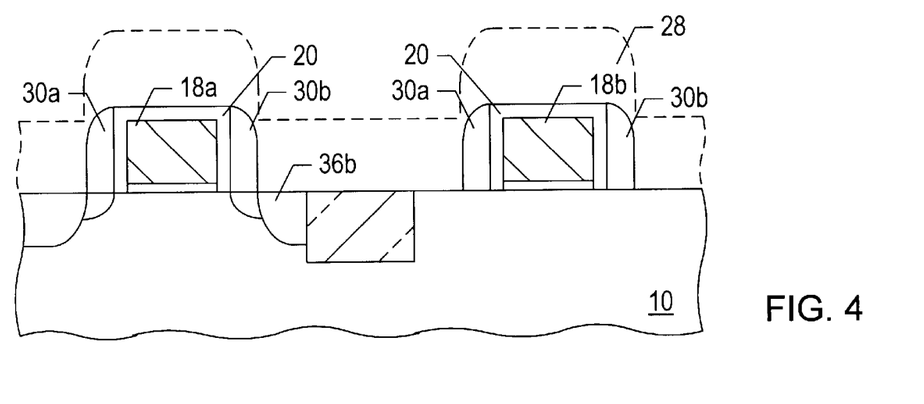
FIG. 4 is a partial cross-sectional view of the semiconductor topography according to a processing step subsequent to FIG. 3, wherein a spacer is formed on opposing sidewall surfaces of the gate conductors.

FIG. 4 depicts a processing step after which photoresist 22 is removed, leaving substrate 10 partially exposed except for regions beneath gate conductors 18. A relatively conformal material 28 can be deposited across the entire semiconductor topography. Material 28 can be deposited using various techniques, a suitable technique being chemical vapor deposition ("CVD"). Alternatively, material 28 may be spin on deposited. In either instance material 28 conforms to the upper topography over and between gate conductors 18. Thereafter, an anisotropic etch is applied to material 28. The anisotropic etch is chosen as a dry etch or plasma etch, and serves to remove material 28 from horizontal surfaces at a faster rate than material from vertical surfaces. Plasma etch techniques are often referred to as "ion-assisted etch". The wafer generally resides on a chuck, and ions from an ion source are directed at a perpendicular angle upon the wafer. The ions dislodge material from the exposed topography, and the chemical (gaseous) etchant interacts with the bond sites to aid in the removal process. The etch duration is terminated, however, before the entirety of material 28 is removed. Accordingly, anisotropic etch duration is chosen to clear material 28 from horizontal surfaces while retaining some material on vertical surfaces. Retainage occurs primarily on the sidewall surfaces of gate conductors 18. More specifically, retainage occurs on the sidewall surfaces of etch stop 20. The retained portion of material 28 is henceforth referred to as a removable spacer 30.

Figure 5:
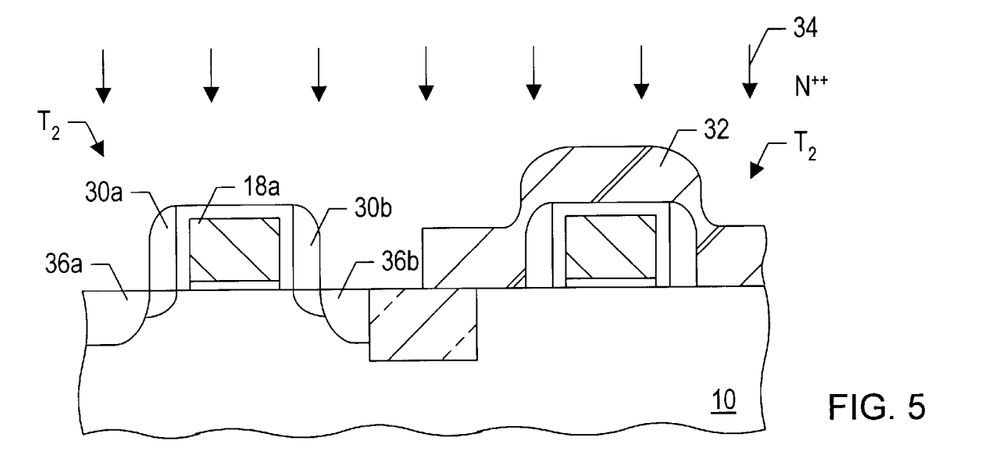
FIG. 5 is a partial cross-sectional view of the semiconductor topography according to a processing step subsequent to FIG. 4, wherein an n-type source/drain implant is selectively placed in the junction regions of the n-channel transistor.

Spacer 30 and more specifically the horizontal thickness of spacer 30 serves to mask subsequent implant species away from the channel underneath gate conductor 18a. FIG. 5 illustrates a processing step subsequent to FIG. 4, whereby only the active regions associated with gate conductor 18a are exposed. The other regions of the semiconductor topography are covered by a masking material ("photoresist") 32. The combination of photoresist 32, gate conductor 18a, spacer 30 proximate the sidewall surfaces of gate conductor 18a, and isolation structure 14 serve to mask receipt of n-type source/drain implant 34 from select regions of substrate 10. The recipient areas of substrate 10 are henceforth referred to as n-type source/drain areas 36. A second temperature thermal anneal $T_2$ may be applied, if desired. Anneal temperature $T_2$ can be equal to or greater than temperature $T_1$ so as to repair implant damage caused by the more concentrated, high energy implants associated with source/drain implant 34.

Figure 6:
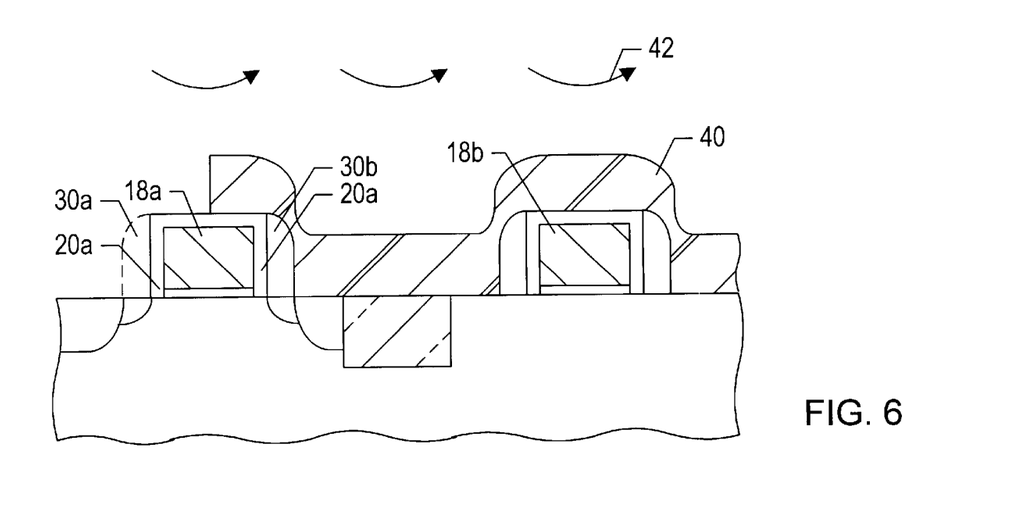
FIG. 6 is a partial cross-sectional view of the semiconductor topography according to a processing step subsequent to FIG. 5, wherein a spacer above the source junction of the n-channel transistor is removed.

FIG. 6 illustrates a processing step subsequent to FIG. 5, wherein photoresist 32 is removed, and replaced with a dissimilarly patterned photoresist 40. Photoresist 40 advantageously serves two functions. First, photoresist 40 exposes only one removable spacer 30a of a pair of removable spacers associated with gate conductor 18a. Exposure of spacer 30a allows removal of the spacer using various wet etch compositions. Depending upon the make-up of spacer 30a, the etchant can be chosen so that it is selective to removing that spacer and not the underlying etch stop 20a. Various etchant compositions are known which are selective to removing, for example, a spacer made of silicon dioxide ("oxide") material as opposed to underlying etch stop silicon nitride ("nitride"), for example. The etchant operation is shown as reference numeral 42, wherein substantially the entire spacer from one sidewall surface of etch stop 20a is removed while retaining the opposing spacer 30b. The second purpose of photoresist 40 is described in reference to FIG. 7.

Figure 7:
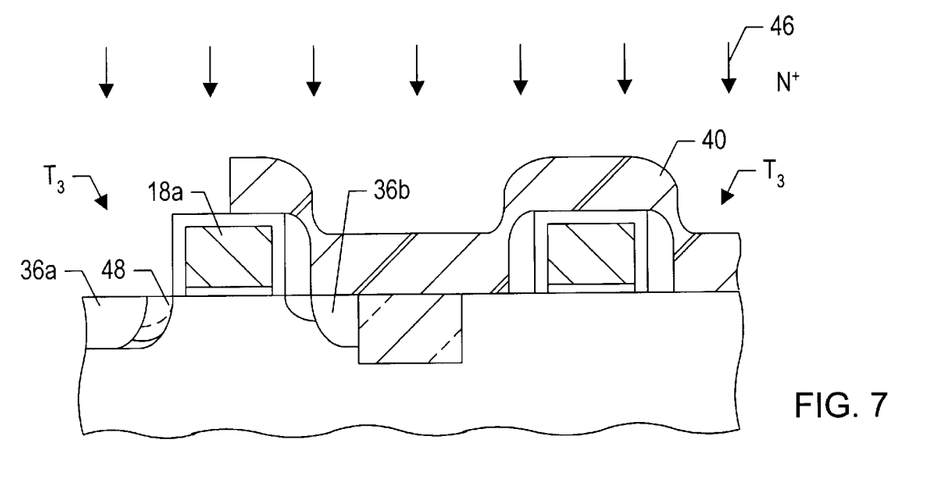
FIG. 7 is a partial cross-sectional view of the semiconductor topography according to a processing step subsequent to FIG. 6, wherein another n-type source/drain (or MDD) is placed into the exposed source junction of the n-channel transistor.

FIG. 7 depicts forward of an implant 46 into the exposed regions of the semiconductor topography. Implant 46 is preferably a relatively heavy concentration n-type implant, similar to the source/drain implant 34 shown in FIG. 5. Implant 46 is also a fairly high energy implant similar to the source/drain implant, wherein implant 46 forms an extension 48 of the previous source implant area 36a. Extension 48 to implant area 36 causes a fairly high conductivity region at the source side of the n-channel. It is recognized that implant area 46 can be either shallow or commensurate in depth with implant area 36. In either instance, the preferred depth and concentration is one which is greater than the pre-existing LDD area of which the source-side LDD is obviated by extension 48. Sufficient depth and concentration thereby minimizes the parasitic resistance of the ensuing NMOS transistor.

Figure 8:
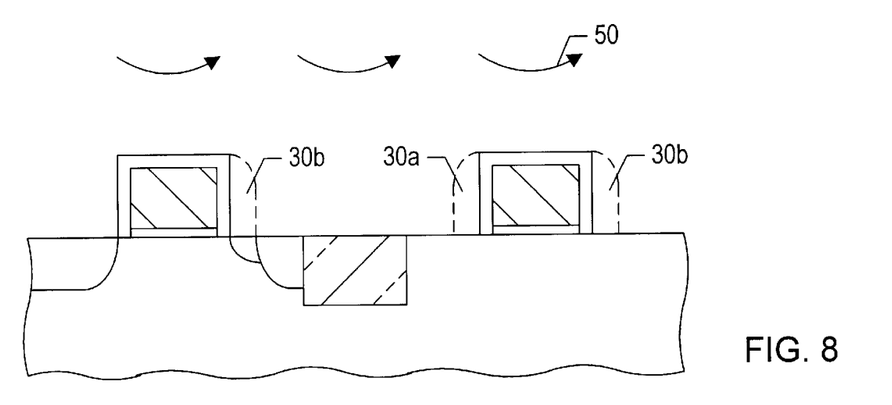
FIG. 8 is a partial cross-sectional view of the semiconductor topography according to a processing step subsequent to FIG. 7, wherein the remaining spacers can be removed from the gate conductors.

Subsequent to n-type implant 46 and removal of photoresist 40, an anneal can be applied. If an anneal is chosen, the anneal temperature $T_3$ is purposely made less than $T_1$ and $T_2$. This is due primarily to the relative proximity and concentration of implant area 48 to the channel area beneath gate conductor 18a. FIG. 8 depicts removal 50 of all remaining spacers 30. Spacers 30 are removed preferably using the same etch composition as that described in reference to FIG. 6. Etch stop 20 ensures the etchant used in removing spacers 30 does not significantly affect gate conductor 18 sidewall surfaces. The benefit of retaining sidewall surface integrity is to ensure an accurate and repeatable gate length integrity of both the p- and n-channel transistors.

Figure 9:
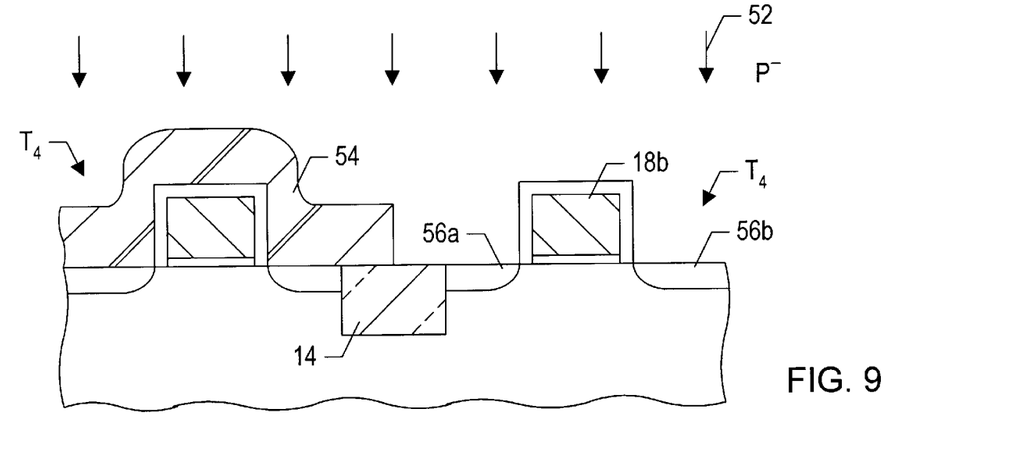
FIG. 9 is a partial cross-sectional view of the semiconductor topography according to a processing step subsequent to FIG. 8, wherein a p-type LDD implant is selectively placed in the junction region of a p-channel transistor; and, FIG. 10 is a partial cross-sectional view of the semiconductor topography concluding a sequence of steps used to form a p-channel transistor having asymmetrically graded p-type junctions similar to the steps beginning with FIG. 4 and ending with FIG. 7 for producing asymmetrically graded n-type junctions.

FIG. 9 depicts early stages of a p-channel transistor formation. Specifically, a p-type LDD implant 52 is shown inserted into exposed active regions of the p-channel transistor. The exposed active regions are defined as regions which are not masked by photoresist 54, isolation region 14 and gate conductor 18b. The non-masked areas are henceforth referred to as p-type LDD implant areas 56. Implant 52 is preferably a relatively low concentration, low energy implant of p-type species selected from the group comprising, for example, B, $B_{11}$ and/or $BF_2$.

After insertion of p-type LDD implant 52, and removal of photoresist 54, the semiconductor substrate and topography may be subjected to an anneal cycle. The anneal cycle, if used, is preferably at a lower temperature $T_4$ then temperatures $T_1$ through $T_3$.

It will be appreciated to those skilled in the art having the benefit of this disclosure that this invention is believed to be capable of forming an LDD structure using a reverse process flow such that higher temperature anneals are performed first, exclusively on n-type implants followed by lower temperature anneals on both pre-existing n-type implants and subsequent p-type implants. The benefit in using a lower temperature anneal subsequent to p-type LDD implant is to ensure the relatively mobile p-type atoms do not overly migrate from their implant positions. If migration does occur, the amount of migration is regulated by the chosen anneal temperature $T_4$ so that migration is somewhat similar to that of n-type LDD implants, n-type MDD implants, and n-type source/drain implants which undergo higher temperature cycles $T_1$ and $T_2$. Adjusting the various anneal temperatures so that n-type implants are subjected to higher anneals earlier in the process sequence affords lower temperature anneals for subsequent p-type implants. This ensures optimal regulation of diffusivity distance, depending upon the implant type, implant concentration and implant depth. The larger the atomic species being implanted and the greater the concentration of that species dictates a higher post-implant anneal relative to lighter species implanted at lesser concentrations.

There are numerous processing steps subsequent to the step shown in FIG. 9. Those steps correlate somewhat to the steps shown subsequent to FIG. 3 except that instead of implanting n-type species and annealing those species as specific temperatures, the steps subsequent to FIG. 9 mandate implant of p-type species and lower temperature anneals. For sake of brevity, illustration of those various steps are not required given the previous teachings set forth in FIGS. 4–8. Specifically, the steps needed to forward source/drain and/or MDD p-type implants adjacent gate conductor 18b are similar to the steps used in implanting source/drain and MDD n-type implants adjacent gate conductor 18a. FIG. 9 depicts the initiation of those various p-type implant and anneal operations adjacent gate conductor 18b. It is understood that removable spacers are formed adjacent the sidewall surfaces of gate conductor 18b similar to that shown in FIG. 4. Instead of masking source/drain n-type implants, spacers formed after FIG. 9 mask p-type source/drain and MDD implants. Thereafter, the spacer on one sidewall surface is removed while the other is retained, similar to that shown in FIG. 6. This affords a source/drain or MDD implant adjacent a channel underlying gate conductor 18b, similar to that shown in FIG. 7. The additional source/drain or MDD implant is forwarded into the source junction near the channel to reduce the parasitic resistance of the source/drain path. The opposing spacer is retained and covered by a masking material so that the pre-existing LDD area in the drain junction 56b remains to minimize HCE. Thereafter, all of the remaining spacers can be removed, if desired.

Figure 10:
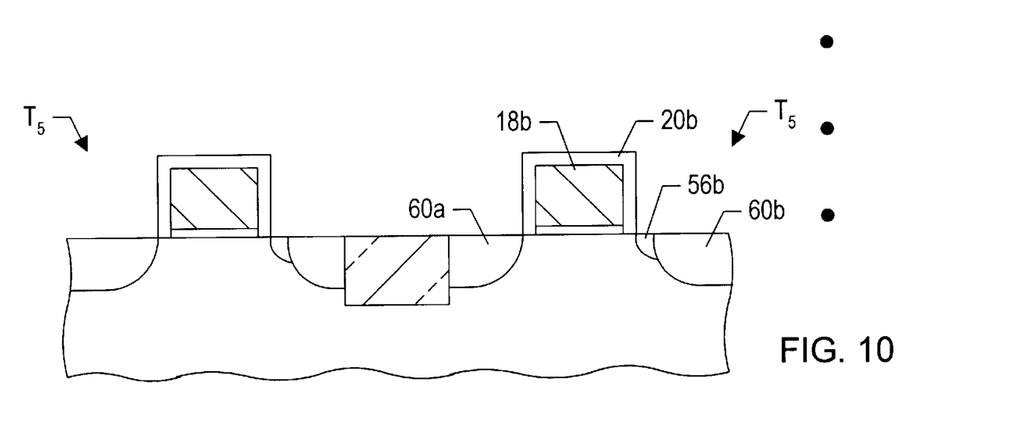

FIG. 10 illustrates conclusion of the sequence of steps needed to form the p-channel transistor beginning with the steps shown in FIG. 9. The ensuing p-channel device includes a p-type source/drain area 60. The source junction of area 60 is designated as 60a, and includes a heavier concentration dopant forwarded adjacent the channel side of source junction 60a. The drain junction 60b retains the lighter concentration p-type LDD area 56b adjacent the drain-side of the channel. The graded drain and less graded p-type source/drain areas more easily maintained if anneal temperature $T_5$ is relatively low. Accordingly, temperature $T_5$ is preferably less than temperature $T_4$, and substantially less than temperatures $T_1$ through $T_3$.

It is understood that, although not shown, a salicide is formed in the junctions of the ensuing NMOS and PMOS transistors. The salicide (self-aligned silicide) results from depositing a refractory metal on the exposed semiconductor topography. The metal undergoes a two-step anneal process. The first anneal cycle causes a first phase reaction. All non-reacted metal is removed except in regions where the silicon atoms are prevalent. Thus, the second anneal step causes a second phase reaction of refractory metal only in silicon-based junctions and possibly on the upper surface of the polysilicon gate conductor. Etch stop 20b, if retained, may serve to prevent "bridging" between the silicide on a semiconductor substrate and the polycide on the upper surface of polysilicon gate 18b. However, before etch stop 20 can serve such a purpose, it is anisotropically removed from horizontal surfaces predominantly on the upper surface of gate conductor 18. The silicide serves to enhance conductivity of subsequent metalization layers drawn to the junctions. For the sake of brevity and clarity of drawings, the silicide formation steps and subsequent metalization layers are not shown. However, it is to be understood that integrated circuit which utilizes the present process will have subsequent fabrication steps involving interlevel dielectrics and one or more layers of metalization.

It will be appreciated to those skilled in the art having the benefit of this disclosure that this invention is believed to be capable of forming MOS transistor junctions which are graded not only to minimize HCE, but also to enhance operation and ohmic connectivity thereto. It is to be understood that the invention shown and described is to be taken as exemplary, presently preferred embodiments. Various modifications and changes may be made to each and every processing step without departing from the spirit and scope of the invention. Given the benefit of this disclosure as set forth in the claims, it is intended that the following claims be interpreted to embrace all such modifications and changes and, accordingly, the specification drawings are to be regarded in an illustrative rather than a restrictive sense.

What is claimed is:

1. A method for forming a transistor having asymmetrically doped n-type and p-type junction areas, comprising:

providing a first gate conductor spaced above an n-channel area interposed between a first pair of junction areas;

using the first gate conductor as a mask, implanting a first concentration of n-type dopants into the first pair of junction areas;

patterning a spacer upon opposed sidewall surfaces of said first gate conductor;

using the spacer and the first gate conductor as a mask, implanting a second concentration of n-type dopants into the first pair of junction areas; and covering one of said first pair of junction areas to allow removal of the spacer from one of the sidewall surfaces and, while retaining coverage, implanting a third concentration of n-type dopants only into the first junction area under which the removed spacer pre-existed to produce an asymmetrically doped pair of n-type junction areas.

2. The method as recited in claim 1, wherein said patterning comprises forming an etch stop layer upon the opposed sidewall surfaces prior to patterning spacer.

3. The method as recited in claim 1, further comprising, subsequent to implanting the third concentration of n-type dopants, performing a first anneal at a first temperature.

4. The method as recited in claim 1, further comprising:

performing a first anneal at a first temperature prior to implanting the second concentration of n-type dopants;

performing a second anneal at a second temperature greater than the first temperature prior to implanting the third concentration of n-type dopants, wherein the second concentration is greater than the first concentration; and subsequent to implanting the third concentration of n-type dopants, performing a third anneal at a third temperature less than the first temperature.

5. The method as recited in claim 3, further comprising:

providing a second gate conductor spaced from the first gate conductor above a p-channel area interposed between a second pair of junction areas;

subsequent to performing said first anneal, while using the second gate conductor as a mask, implanting a first concentration of p-type dopants into the second pair of junction areas;

patterning a spacer upon opposed sidewall surfaces of said second gate conductor;

using the spacer and the second gate conductor as a mask, implanting a second concentration of p-type dopants into the second pair of junction areas; and covering one of said first pair of junction areas to allow removal of the spacer from one of the sidewall surfaces and, while retaining coverage, implanting a third concentration of p-type dopants only into the second junction area under which the removed spacer pre-existed to produce an asymmetrically doped pair of p-type junction areas.

6. The method as recited in claim 5, wherein said first and second gate conductors are patterned from a layer of polycrystalline silicon.

7. The method as recited in claim 5, wherein said patterning a spacer upon first and second gate conductors comprises:

depositing a dielectric material across said first and second gate conductors; and anisotropically removing said dielectric material except upon sidewall surfaces of said first and second gate conductors.

8. The method as recited in claim 5, further comprising, subsequent to implanting the third concentration of p-type dopants, performing a second anneal at a second temperature-less than said first temperature.

9. The method as recited in claim 8, wherein said first and second temperatures are selected to ensure that the migration of n-type dopants is approximately the same as the migration of p-type dopants.

10. The method as recited in claim 4, further comprising:

providing a second gate conductor spaced from the first gate conductor above a p-channel area interposed between a second pair of junction areas;

subsequent to performing said third anneal, while using the second gate conductor as a mask, implanting a first concentration of p-type dopants into the second pair of junction areas;

patterning a spacer upon opposed sidewall surfaces of said second gate conductor; using the spacer and the second gate conductor as a mask, implanting a second concentration of p-type dopants into the second pair of junction areas; and covering one of said first pair of junction areas to allow removal of the spacer from one of the sidewall surfaces and, while retaining coverage, implanting a third concentration of p-type dopants only into the second junction area under which the removed spacer pre-existed to produce an asymmetrically doped pair of p-type junction areas.

11. The method as recited in claim 10, further comprising:

performing a fourth anneal at a fourth temperature less than the third temperature after implanting the first concentration of p-type dopants; and performing a fifth anneal at a fifth temperature less than the fourth temperature after implanting the third concentration of p-type dopants.

12. The method as recited in claim 11, wherein said first, second, third, fourth, and fifth temperatures are selected to ensure that the migration of n-type dopants is approximately the same as the migration of p-type dopants.

13. A method for forming an integrated circuit, comprising:

forming n-type lightly doped drain areas within a semiconductor substrate substantially adjacent to opposing sidewall surfaces of a first gate conductor;

forming n-type source and drain areas within said semiconductor substrate a spaced distance from said opposing sidewall surfaces of said first gate conductor;

implanting an n-type dopant into the semiconductor substrate substantially adjacent only one of the opposing sidewall surfaces of the first gate conductor to produce an asymmetrically doped n-channel transistor;

annealing the semiconductor substrate at a first temperature;

forming p-type lightly doped drain areas within the semiconductor substrate substantially adjacent to opposing sidewall surfaces of a second gate conductor, wherein said second gate conductor is laterally spaced from said first gate conductor;

forming p-type source and drain areas within said semiconductor substrate a spaced distance from said opposing sidewall surfaces of said first gate conductor; and implanting a p-type dopant into the semiconductor substrate substantially adjacent only one of the opposing sidewall surfaces of the second gate conductor to produce an asymmetrically doped p-channel transistor;

annealing the semiconductor substrate at a second temperature less than the first temperature.

14. The method as recited in claim 13, further comprising:

prior to forming said n-type source and drain areas and subsequent to forming said n-type lightly doped drain areas, annealing the semiconductor at a third temperature greater than said first temperature;

prior to implanting said n-type dopant and subsequent to forming said n-type source and drain areas, annealing the semiconductor at a fourth temperature equal to or greater than said third temperature; and prior to forming said p-type source and drain areas and subsequent to forming said p-type lightly doped drain areas, annealing the semiconductor at a fifth temperature less than said first temperature and greater than said second temperature.

15. The method as recited in claim 11, wherein said first and second temperatures are selected to ensure that the migration of n-type dopants is approximately the same as the migration of p-type dopants.

16. A method for forming a CMOS integrated circuit, comprising:

providing a first gate conductor interposed between a first pair of junction areas;

implanting a first concentration of n-type dopants into said first pair of junction areas substantially adjacent to opposing sidewall surfaces of said first gate conductor;

performing a first anneal at a first temperature;

implanting a second concentration of n-type dopants into said first pair of junction areas a spaced distance from said opposing sidewall surfaces of said first gate conductor;

performing a second anneal at a second temperature equal to or greater than said first temperature;

implanting a third concentration of n-type dopants into one of said first pair of junction areas substantially adjacent to one of said opposing sidewall surfaces of said first gate conductor;

performing a third anneal at a third temperature less than said first temperature;

providing a second gate conductor interposed between a second pair of junction areas, wherein said second gate conductor is spaced apart from said first gate conductor by an isolation structure;

implanting a first concentration of p-type dopants into said second pair of junction areas substantially adjacent to opposing sidewall surfaces of said second gate conductor;

performing a fourth anneal at a fourth temperature less than said third temperature;

implanting a second concentration of p-type dopants into said second pair of junction areas a spaced distance from said opposing sidewall surfaces of said second gate conductor;

implanting a third concentration of p-type dopants into one of said second pair of junction areas substantially adjacent to one of said opposing sidewall surfaces of said second gate conductor; and performing a fifth anneal at a fifth temperature less than said fourth temperature.

17. The method as recited in claim 16, wherein said first concentration of n-type dopants is less than said second concentration of n-type dopants, and wherein said first concentration of p-type dopants is less than said second concentration of p-type dopants.

18. The method as recited in claim 16, wherein said first, second, third, fourth, and fifth temperatures are selected to ensure that the migration of n-type dopants is approximately the same as the migration of p-type dopants.

19. A method for forming an integrated circuit on a semiconductor substrate, comprising:

providing a first gate conductor spaced above an n-channel area interposed between a first pair of junction areas formed within said semiconductor substrate;

using said first gate conductor as a mask, implanting an n-type dopant into said first pair of junction areas;

annealing said semiconductor substrate at a first temperature;

providing a second gate conductor spaced from the first gate conductor above a p-channel area interposed between a second pair of junction areas;

subsequent to performing said first anneal, while using said second gate conductor as a mask, implanting a p-type dopant into the second pair of junction areas; and annealing said semiconductor substrate at a second temperature.

20. The method as recited in claim 19, wherein said second temperature is less than said first temperature.

21. The method as recited in claim 19, wherein said first and second temperatures are selected to ensure that the migration of said n-type dopant is approximately the same as the migration of said p-type dopant.

* * * * *

UNITED STATES PATENT AND TRADEMARK OFFICE
CERTIFICATE OF CORRECTION

PATENT NO. : 5,837,572

DATED : November 17, 1998

INVENTOR(S) : Gardner et al.

It is certified that error appears in the above-identified patent and that said Letters Patent is hereby corrected as shown below:

Claim 2, col. 10, line 64, after "prior to patterning" please insert --the--.

Claim 8, col. 11, line 47, before "less than said first temperature" please delete "-".

Signed and Sealed this

Sixteenth Day of March, 1999

Attest:

Q. TODD DICKINSON

Attesting Officer

Acting Commissioner of Patents and Trademarks